(12) United States Patent
Murakami et al.

(10) Patent No.: US 9,799,535 B2
(45) Date of Patent: Oct. 24, 2017

(54) HEAT-TREATMENT FURNACE

(71) Applicant: SHIN-ETSU CHEMICAL CO., LTD., Tokyo (JP)

(72) Inventors: Takashi Murakami, Annaka (JP); Takenori Watabe, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/084,276

(22) Filed: Mar. 29, 2016

(65) Prior Publication Data

US 2016/0329216 A1    Nov. 10, 2016

Related U.S. Application Data

(62) Division of application No. 13/701,953, filed as application No. PCT/JP2011/062753 on Jun. 3, 2011, now abandoned.

(30) Foreign Application Priority Data

Jun. 4, 2010   (JP) ................................. 2010-128998

(51) Int. Cl.
*F27D 5/00*     (2006.01)
*H01L 21/324*   (2006.01)
(Continued)

(52) U.S. Cl.
CPC ............ *H01L 21/324* (2013.01); *H01L 21/22* (2013.01); *H01L 21/67109* (2013.01); *H01L 21/67754* (2013.01)

(58) Field of Classification Search
CPC ............... H01L 21/22; H01L 21/67109; H01L 21/67754; H01L 21/67178; H01L 21/6732;
(Continued)

(56) References Cited

U.S. PATENT DOCUMENTS

| 4,449,037 A * | 5/1984 | Shibamata | ............... C30B 25/10 |
| | | | 118/50.1 |
| 2004/0175956 A1* | 9/2004 | Pellegrin | ................. C30B 29/06 |
| | | | 438/770 |

FOREIGN PATENT DOCUMENTS

| JP | 64-82971 A | 7/1979 |
| JP | 64-156470 A | 12/1979 |

(Continued)

OTHER PUBLICATIONS

International Search Report for PCT/JP2011/062753, mailing date of Aug. 30, 2011.
(Continued)

*Primary Examiner* — Shawntina Fuqua
(74) *Attorney, Agent, or Firm* — Westerman, Hattori, Daniels & Adrian

(57) ABSTRACT

The disclosed heat-treatment furnace, used in a semiconductor-substrate heat-treatment step, is characterized by the provision of a cylindrical core, both ends of which have openings sized so as to allow insertion and removal of semiconductor substrates. This reduces standby time between batches during consecutive semiconductor heat treatment, thereby improving productivity. Furthermore, the use of a simple cylindrical shape for the structure of the core reduces the frequency at which gas-introduction pipe sections fail, thereby decreasing the running cost of the heat-treatment process.

8 Claims, 3 Drawing Sheets

(51) Int. Cl.
*H01L 21/22* (2006.01)
*H01L 21/67* (2006.01)
*H01L 21/677* (2006.01)

(58) Field of Classification Search
CPC ......... H01L 21/67313; H01L 21/67303; H01L 21/67309; H01L 21/67326; H01L 21/67389; H01L 21/677; H01L 21/67703; H01L 21/67739; H01L 21/67736; H01L 21/6776; H01L 21/67763; H01L 21/67772; H01L 21/67781; H01L 21/6779; C30B 31/00; C30B 31/12; C30B 31/14; C30B 31/16; C30B 31/165; C30B 31/18; C30B 31/20; C30B 31/22; C30B 31/103; C30B 31/106; C30B 33/005; C30B 33/00; C30B 25/10; C30B 25/12; C30B 25/14; C30B 25/16; C30B 25/165; C30B 19/063; C30B 19/08; C30B 19/10
See application file for complete search history.

(56) References Cited

FOREIGN PATENT DOCUMENTS

| | | |
|---|---|---|
| JP | 58-154227 A | 9/1983 |
| JP | 61-59722 A | 3/1986 |
| JP | 61-280614 A | 12/1986 |
| JP | 63-213925 A | 9/1988 |
| JP | 64-030234 A | 2/1989 |
| JP | 64-89514 A | 4/1989 |
| JP | 02-205318 A | 8/1990 |
| JP | 2-306619 A | 12/1990 |
| JP | 4-155821 A | 5/1992 |
| JP | 4-364028 A | 12/1992 |
| JP | 5-102054 A | 4/1993 |
| KR | 90000835 B1 | 2/1990 |
| KR | 20080104580 A | 12/2008 |

OTHER PUBLICATIONS

Singapore Written Opinion dated Dec. 23, 2013, issued in corresponding Singapore Patent Application No. 201208903-3 (13 pages).

Korean Office Action dated Dec. 30, 2013, issued in corresponding Korean Patent Application No. 10-2012-7034348 (5 pages).

Office Action dated Apr. 28, 2015, issued in corresponding Russian Patent Application No. 2012157235/28, with English translation(8 pages).

Extended (supplementary) European Search Report dated Feb. 10, 2017, issued in counterpart European Patent pplication No. 11789911.2. (7 pages).

* cited by examiner

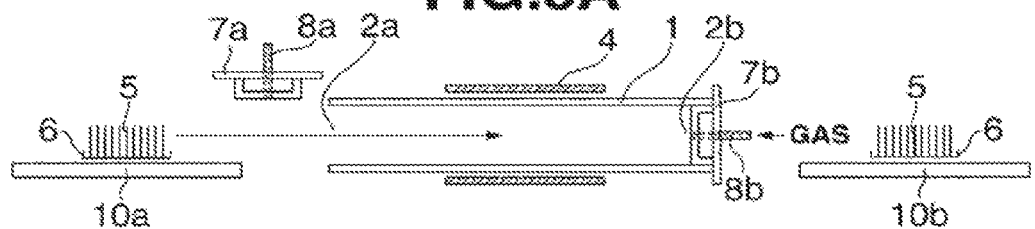
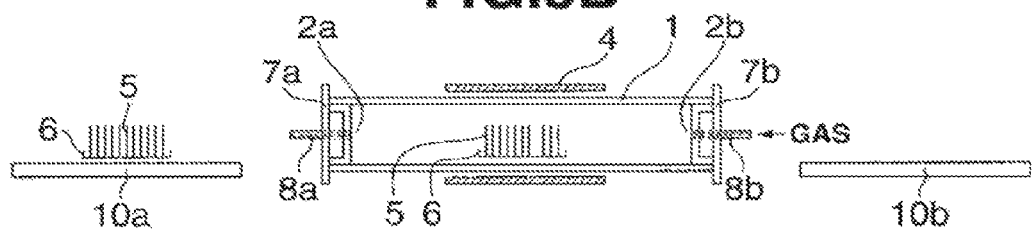
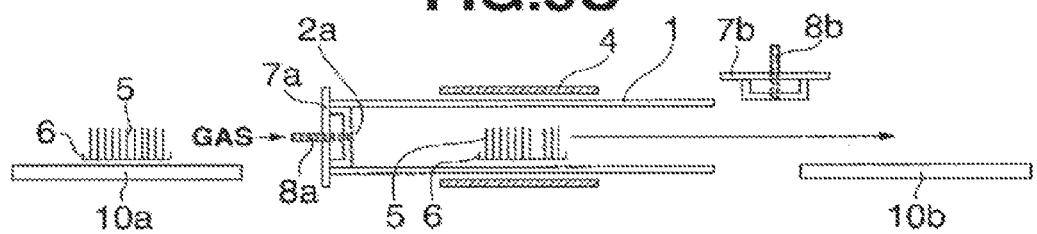
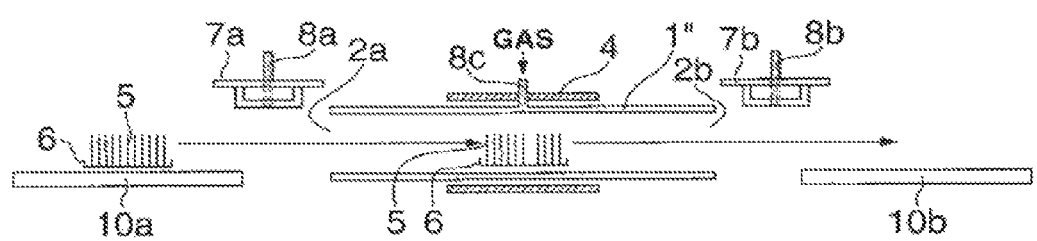
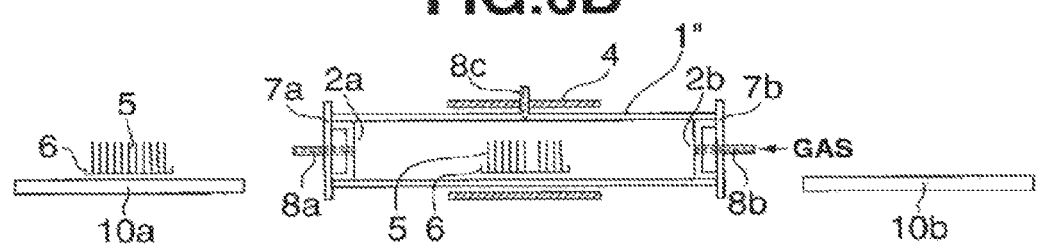

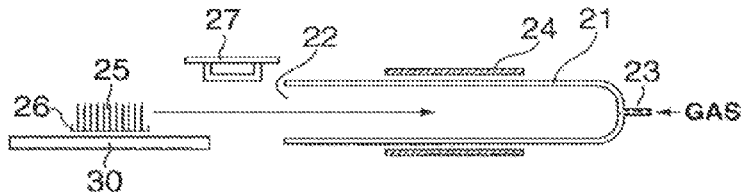
FIG.7A
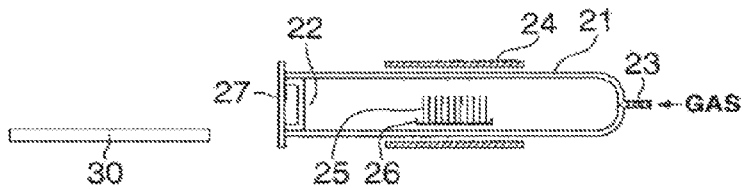
FIG.7B
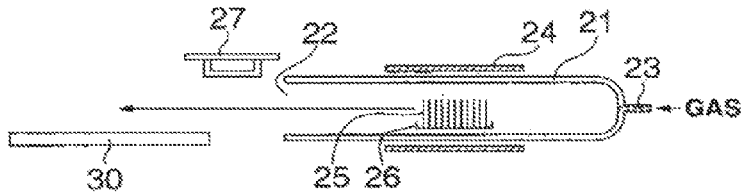
FIG.7C
FIG.8
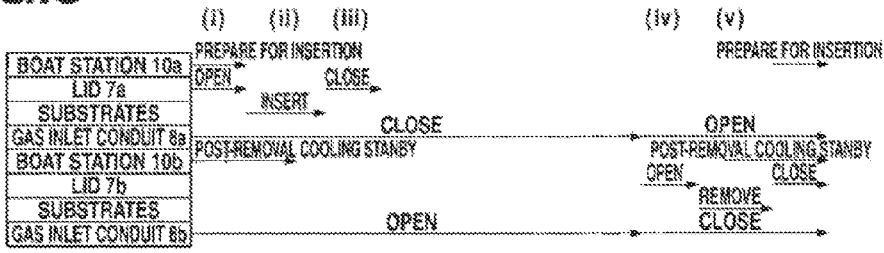
FIG.9
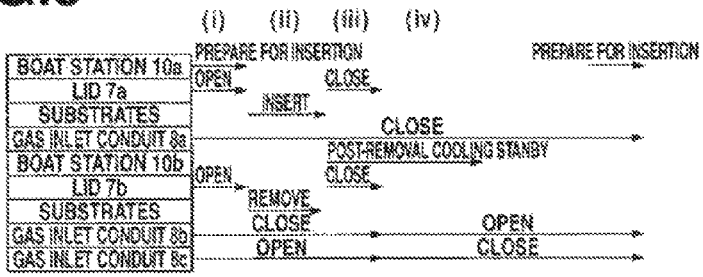
FIG.10

HEAT-TREATMENT FURNACE

CROSS REFERENCE TO RELATED APPLICATIONS

This is a divisional of U.S. application Ser. No. 13/701,953 filed Mar. 4, 2013, which is a 371 of International Application No. PCT/JP2011/062753 filed Jun. 3, 2011, the entire contents is herein incorporated by reference.

TECHNICAL FIELD

This invention relates to a heat-treatment furnace for use in the heat treatment of semiconductor substrates, typically silicon substrates.

BACKGROUND ART

In the prior art, a semiconductor heat treating process is generally carried out in a furnace of the following design in order to prevent any contamination from the ambient air, heater or the like. As shown in FIG. 4, a furnace core tube 21 of high-purity quartz or the like which is provided with an opening 22 at one end and a gas inlet conduit 23 at the other end is disposed inside a cylindrical heater 24 which is previously installed in the furnace. A boat 26 of high-purity quartz or the like having semiconductor substrates 25 rested thereon is moved into the furnace core tube 21 through the opening 22 and set in place. A lid 27 of high-purity quartz or the like is closed to establish a substantially tight seal. High-purity gas such as nitrogen or argon is fed from the gas inlet conduit 23 whereas the gas is discharged out of the furnace through small gaps between the core tube 21 and the lid 27. While the in-furnace atmosphere is kept clean in this way, heat treatment for dopant diffusion or oxidation is carried out.

FIGS. 7A-7C illustrate one exemplary heat-treatment flow using a heat-treatment furnace including such a core tube and FIG. 10 illustrates one exemplary time sequence of the heat treatment. The prior art heat treating process is described by referring to these figures.

(1) A predetermined number of semiconductor substrates 25 are rested on the boat 26, which is held on standby at a boat station 30. See FIG. 7A and FIG. 10 (i).

(2) The lid 27 of the core tube 21 is opened. The boat 26 having semiconductor substrates 25 rested thereon is forcedly moved from the boat station 30 to a predetermined position at the center of the furnace, using a rod of high-purity quartz or the like (not shown). See FIG. 7A and FIG. 10 (ii) and (iii).

(3) The lid 27 is closed. The semiconductor substrates 25 are heat treated according to the predetermined thermal profile. See FIG. 7B and FIG. 10 (iv).

(4) After the heat treatment, the lid 27 is opened. The boat 26 having semiconductor substrates 25 rested thereon is forcedly moved from the predetermined position in the furnace to the boat station 30, using a rod or the like, and cooled there. See FIG. 7C and FIG. 10 (v) to (vii).

For the duration from insertion to removal of the boat, high-purity gas such as nitrogen may be continuously fed from the gas inlet conduit 23 to keep cleanness in the furnace.

In this process, after the boat is taken out of the furnace, the semiconductor substrates must be cooled at the boat station until a handleable temperature is reached. When it is desired to continuously carry out a predetermined heat treatment, the system remains unready for insertion of a next batch, introducing a standby time between consecutive heat treatment batches.

Besides the furnace core tube mentioned above, the structure of a heat treatment furnace for use in the semiconductor substrate heat treating process is proposed, for example, in JP-A H05-102054 (Patent Document 1, Sony Corp., diffusion furnace). The heat-treatment furnace is described therein as comprising a furnace core tube which is open at one end, a shutter for operatively closing the open end, and a partition disposed in the core tube and inside the open end so as to define a gap between the partition and the inner wall of the core tube, the shutter being provided with a vent. This design allegedly eliminates any adverse impact by entry of ambient air.

CITATION LIST

Patent Document

Patent Document 1: JP-A H05-102054

SUMMARY OF INVENTION

Technical Problem

In the heat-treatment furnace comprising a core tube of the above-mentioned structure, however, semiconductor substrates must be moved into and out of the furnace via only one end of the core tube because of the structure. Furthermore, as indicated above, the semiconductor substrates after being taken out of the hot furnace must be cooled at the boat station until a handleable temperature is reached. For continuous implementation of the heat treatment, this introduces a standby time between consecutive heat treatment batches. Particularly when semiconductor devices which are subject to a relatively short duration of heat treatment, typically crystalline silicon solar cells, are heat treated, the standby time accounts for a relatively high proportion among the overall heat treatment time, which becomes the major cause of restricting the productivity of the heat treatment process. Also in the case of a furnace core tube of the above-mentioned structure, upon replacement of the furnace core tube for periodic cleaning and shelf storage thereof, a thin tubular gas inlet conduit can be broken. Since the core tube of high-purity quartz or the like is expensive, the expenses for repair and purchase of a new one are high. This is one of the factors that cause to increase the running cost of the heat treatment process.

Furthermore, when a heat treatment furnace of the continuous mode having inlet and outlet as typified by the belt conveyor or walking beam system is employed, the furnace has low gas tightness due to the presence of the belt or beam, even in the structure provided with shutters at the inlet and outlet, and fails to prevent inflow of ambient air, giving rise to a problem that the carrier lifetime of semiconductor substrates can be significantly reduced by the heat treatment. Such continuous mode heat treatment furnaces of the belt conveyor or walking beam system also have problems including a small number of simultaneously processable workpieces per unit area, and low thermal efficiency.

An object of the invention, which has been made under the above-mentioned circumstances, is to provide a heat-treatment furnace which is adapted to reduce a standby time between batches during consecutive heat treatment of semiconductor substrates for thereby improving productivity and to reduce the frequency of breaking of gas inlet conduits for thereby saving the running cost of the heat-treatment process.

Solution to Problem

Making extensive investigations to attain the above object, the inventors have found that a furnace core tube for use in heat treatment process is structured as a cylindrical shape tube which is provided at opposite ends with openings having a sufficient size to allow semiconductor substrates to be moved into and out of the core tube, a lid is detachably mounted to the core tube to block each opening to substantially seal the core tube, the core tube or lid is provided with a thin gas inlet conduit for introducing gas into the core tube, whereby the atmosphere within the furnace can be kept clean during heat treatment, and the semiconductor substrates may be moved into and out of the core tube and heat treated therein while the lids at opposite ends are opened and closed as necessary, whereby a standby time between batches during consecutive heat treatment can be reduced for thereby improving productivity. Since the core tube is structured as a simple cylindrical shape, the frequency of breaking of gas inlet conduits is reduced and the cost of the core tube itself is reduced. As a result, the running cost of the heat-treatment process can be saved. The invention is predicated on these findings.

Accordingly, the invention provides a heat-treatment furnace as defined below.

(1) A heat-treatment furnace for use in the heat treatment of semiconductor substrates, comprising a cylindrical core tube which is provided at opposite ends with openings having a sufficient size to allow semiconductor substrates to be moved into and out of the core tube.

(2) The heat-treatment furnace of (1), further comprising lids each of which is detachably mounted to the core tube to block the opening to substantially seal the core tube.

(3) The heat-treatment furnace of (1) or (2), further comprising thin gas inlet conduits penetrating through the lids for introducing gas into the core tube.

(4) The heat-treatment furnace of any one of (1) to (3), further comprising thin gas inlet conduits disposed near opposite ends of the core tube for introducing gas into the core tube.

(5) The heat-treatment furnace of any one of (1) to (4), further comprising a thin gas inlet conduit disposed near the longitudinal center of the core tube for introducing gas into the core tube.

(6) The heat-treatment furnace of any one of (1) to (5), wherein the opening in the core tube has an inner diameter which is at least 95% of the inner diameter of the core tube at the center.

(7) The heat-treatment furnace of any one of (1) to (6), further comprising at least one boat station disposed outside the core tube and in proximity to the opening in the core tube, the boat station carrying a boat having semiconductor substrates rested thereon on standby.

(8) The heat-treatment furnace of any one of (1) to (7), wherein the heat treatment is intended to diffuse a p- or n-type dopant into silicon substrates.

(9) The heat-treatment furnace of any one of (1) to (7), wherein the heat treatment is intended to oxidize silicon substrates.

Advantageous Effects of Invention

The invention reduces a standby time between batches during consecutive heat treatment of semiconductor substrates, thereby improving productivity. The core tube structured as a simple cylindrical shape reduces the frequency of breaking of gas inlet conduits, thereby saving the running cost of the heat-treatment process.

BRIEF DESCRIPTION OF DRAWINGS

FIGS. 5A, 5B and 5C are schematic cross-sectional views of a heat-treatment flow using one exemplary heat-treatment furnace of the invention.

FIGS. 6A and 6B are schematic cross-sectional views of a heat-treatment flow using another exemplary heat-treatment furnace of the invention.

FIGS. 7A, 7B and 7C are schematic cross-sectional views of a heat-treatment flow using the conventional heat-treatment furnace.

FIG. 8 illustrates a time sequence of heat treatment using one exemplary heat-treatment furnace of the invention.

FIG. 9 illustrates a time sequence of heat treatment using another exemplary heat-treatment furnace of the invention.

FIG. 10 illustrates a time sequence of heat treatment using the conventional heat-treatment furnace.

DESCRIPTION OF EMBODIMENTS

Embodiments of the invention are described below in detail with reference to the drawings, but the invention is not limited thereto. Throughout the drawings to illustrate the embodiments, parts having the same functions are designated by like numerals and their iterative description is omitted.

Figure 1:
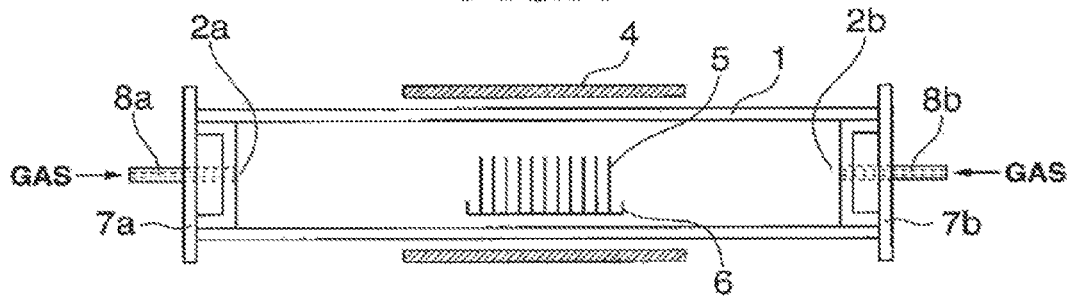
FIG. 1 is a schematic cross-sectional view of one embodiment of the invention including a furnace core tube and lids having gas inlet conduits.

FIG. 1 illustrates the structure of one exemplary core tube included in the heat-treatment furnace of the invention. In FIG. 1, a cylindrical core tube 1 has openings 2a, 2b at axially or longitudinally opposite ends and is concentrically enclosed by a cylindrical heater 4 which is installed in a heat-treatment furnace (not shown). A boat 6 on which semiconductor substrates 5 are rested may be moved into and out of the core tube through either one of the openings 2a, 2b. The openings 2a, 2b may be substantially blocked and sealed by lids 7a, 7b, respectively. The lids 7a, 7b are integrally provided with thin gas inlet conduits 8a, 8b which penetrate through the lids 7a, 7b in a gas-tight manner for introducing gas into the core tube. With the lids 7a, 7b closed, gas can be fed from the selected one of gas inlet conduits 8a, 8b. The gas inlet conduits 8a, 8b need not necessarily be integrated with the lids 7a, 7b or protruded from the lids 7a, 7b. A separate structure is acceptable which consists of bores in the lids 7a, 7b and gas inlet conduits such that the conduit may be fixedly engaged in the bore by snug fit.

Figure 2:
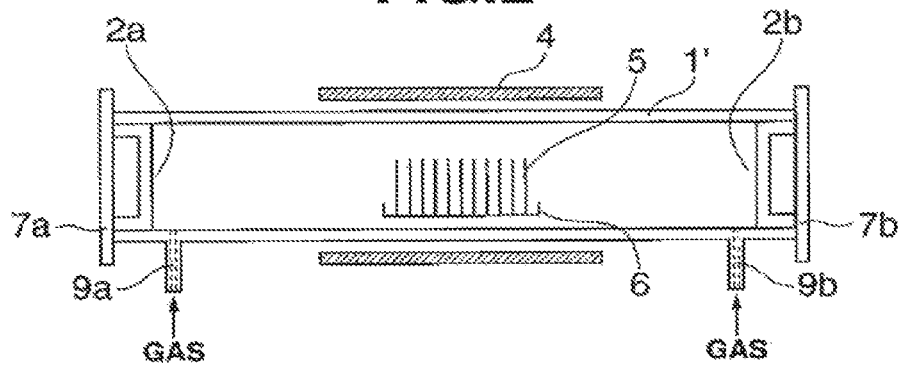
FIG. 2 is a schematic cross-sectional view of another embodiment of the invention including a furnace core tube having gas inlet conduits disposed near opposite ends and at the lower side thereof, and lids.

FIG. 2 illustrates the structure of another exemplary core tube included in the heat-treatment furnace of the invention. In FIG. 2, a cylindrical core tube 1' has openings 2a, 2b at axially or longitudinally opposite ends and thin gas inlet conduits 9a, 9b disposed near the opposite ends and at the lower side. The core tube 1' is concentrically enclosed by a cylindrical heater 4 which is installed in a heat-treatment furnace (not shown). A boat 6 on which semiconductor substrates 5 are rested may be moved into and out of the core tube through either one of the openings 2a, 2b. The openings 2a, 2b may be substantially blocked and sealed by lids 7a, 7b, respectively. With the lids 7a, 7b closed, gas can be fed from the selected one of gas inlet conduits 9a, 9b. The gas inlet conduits 9a, 9b need not necessarily be integrated with or protruded from the core tube 1'. A separate structure is acceptable which consists of bores and gas inlet conduits such that the conduit may be fixedly engaged in the bore by snug fit.

Figure 3:
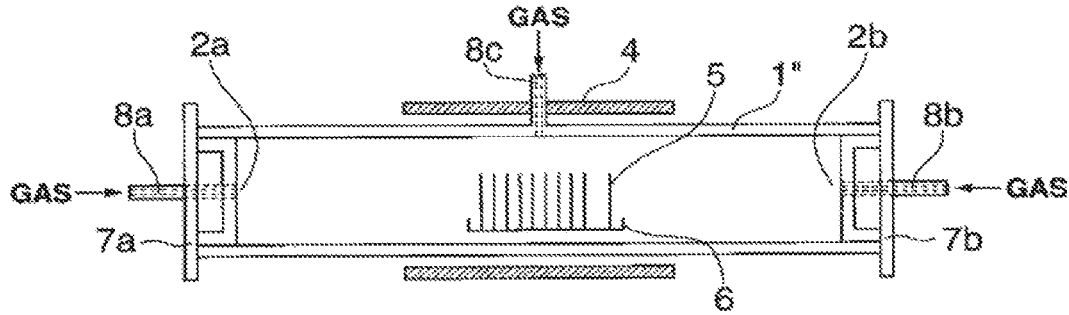
FIG. 3 is a schematic cross-sectional view of a further embodiment of the invention including a furnace core tube having a gas inlet conduit disposed near the center thereof, and lids.

FIG. 3 illustrates the structure of a further exemplary core tube included in the heat-treatment furnace of the invention. In FIG. 3, a cylindrical core tube 1" has openings 2a, 2b at axially or longitudinally opposite ends and a gas inlet conduit 8c disposed near the longitudinal center and at the upper side. The core tube 1" is concentrically enclosed by a cylindrical heater 4 which is installed in a heat-treatment furnace (not shown). A boat 6 on which semiconductor substrates 5 are rested may be moved into and out of the core tube through either one of the openings 2a, 2b. The openings 2a, 2b may be substantially blocked and sealed by lids 7a, 7b, respectively. The lids 7a, 7b are integrally provided with thin gas inlet conduits 8a, 8b which penetrate through the lids 7a, 7b in a gas-tight manner for introducing gas into the core tube. With the lids 7a, 7b closed, gas can be fed from the selected one of gas inlet conduits 8a, 8b, 8c. If gas is fed into the core tube from the gas inlet conduit 8c with the lids 7a, 7b kept open, then the gas may flow toward the openings 2a, 2b. The gas inlet conduits 8a, 8b, 8c need not necessarily be integrated with or protruded from the lids 7a, 7b or core tube 1". A separate structure is acceptable which consists of bores and gas inlet conduits such that the conduit may be fixedly engaged in the bore by snug fit.

The core tube, lids, and gas inlet conduits used herein are typically made of high-purity quartz, high-purity silicon carbide (SiC) or similar material in order that the components are resistant to the high temperature of heat treatment and can keep the furnace interior clean.

The size of the core tube is not particularly limited. The inner diameter of the openings at opposite ends of the core tube may be sized so as to allow the semiconductor substrate-carrying boat to be moved into and out of the core tube, and is preferably at least 95% of the inner diameter of the core tube at the center, and typically equal to the inner diameter of the core tube at the center.

The gas inlet conduits have an outer diameter of preferably 5 to 25 mm, more preferably 10 to 20 mm, an inner diameter of preferably 3 to 20 mm, more preferably 5 to 15 mm, and a protrusion length of preferably 50 to 200 mm, more preferably 100 to 150 mm. When the gas inlet conduits are provided near opposite ends and at lower side of the core tube as shown in FIG. 2, the gas inlet conduits are preferably spaced inward a distance of 10 to 200 mm, more preferably 20 to 150 mm from the openings.

Though not shown in FIGS. 1 to 3, besides the core tube, at least one boat station is preferably provided outside the core tube and in proximity to the opening where the boat 6 having substrates 5 rested thereon is on standby. More preferably at least one boat station is provided at a predetermined distance from each opening. The boat station may be made of the same material as the core tube, lids, and gas inlet conduits. The size of the boat station is not particularly limited as long as it allows the boat to stand by. For example, a boat station having a wall thickness of 4 mm, a length of 1,000 mm, and a width of 200 mm and defining an arcuate curved surface with a radius of 100 mm and an angle of 60° may be used.

The heat-treatment process using the heat-treatment furnace of the invention is described. Semiconductor substrates are heat treated in the heat-treatment furnace comprising a core tube of the structure as shown in FIGS. 1 to 3. Preferably a high-purity gas such as argon, nitrogen or oxygen is introduced from the gas inlet conduit while the high-purity gas may escape from the furnace through a small gap between the lid and the core tube. The gas flow prevents the ambient air from entering the furnace and keeps the atmosphere in the furnace clean during heat treatment. Then an array of semiconductor substrates on the boat positioned at the center of the core tube can be heat treated without a substantial loss of the carrier lifetime of the semiconductor substrates.

Next, specific heat-treatment processes are described. FIGS. 5A-5C illustrate an exemplary heat-treatment flow using a heat-treatment furnace comprising a core tube according to the invention and FIG. 8 illustrates a time sequence of this heat treatment. The core tube in FIGS. 5A-5C is the same as in FIG. 1.

(1) A predetermined number of semiconductor substrates 5 are rested on the boat 6, which stands by at the boat station 10a (FIG. 5A and FIG. 8 (i)). The substrates used herein may be p- or n-type silicon substrates or the like.

(2) With the lid 7a of the core tube 1 opened, the boat 6 having semiconductor substrates 5 rested thereon is forcedly moved from the boat station 10a to a predetermined position at the furnace center (FIG. 5A and FIG. 8 (ii)).

(3) With the lid 7a closed, the semiconductor substrates 5 are heat treated according to a predetermined thermal profile (FIG. 5B and FIG. 8 (iii)). In the case of dopant diffusion treatment, for example, the atmosphere may be an inert gas such as nitrogen or argon, or oxygen, phosphorus oxychloride, diborane or the like. The treatment temperature and time are not particularly limited as they vary with the necessary diffusion profile, oxide film thickness and other factors. The invention becomes more effective in the event of a brief heat treatment profile.

During boat insertion and heat treatment, a high-purity gas such as nitrogen, argon or oxygen may be fed from the gas inlet conduit 8b to keep the furnace interior clean.

(4) After the heat treatment, the lid 7b is opened, and the boat 6 having semiconductor substrates 5 rested thereon is moved from the predetermined position in the furnace to the boat station 10b and cooled for 10 to 30 minutes (FIG. 5C and FIG. 8 (iv)-(v)).

During movement of the boat into and out of the core tube, a high-purity gas such as nitrogen, argon or oxygen may be fed from the gas inlet conduit 8a at a flow rate of 5 to 50 L/min to keep the furnace interior clean.

This embodiment including two boat stations has the advantage of reduced standby time in that when the boat is taken out of the core tube and cooled at one boat station 10b, a boat of a next batch may be moved from the other boat station 10a into the core tube. These boats may be moved into and out of the core tube at the same time. Notably, a rod of high-purity quartz (not shown) may be used in moving the boat into and out of the core tube.

FIGS. 6A and 6B illustrate another exemplary heat-treatment flow using a heat-treatment furnace comprising a core tube according to the invention and FIG. 9 illustrates a time sequence of this heat treatment. The core tube in FIGS. 6A and 6B is the same as in FIG. 3.

(1) A predetermined number of semiconductor substrates 5 are rested on the boat 6, which stands by at the boat station 10*a* (FIG. 6A and FIG. 9 (i)).
(2) With the lid 7*a* of the core tube 1″ opened, the boat 6 having semiconductor substrates 5 rested thereon is forcedly moved from the boat station 10*a* to a predetermined position at the furnace center (FIG. 6A and FIG. 9 (ii)).
(3) With the lid 7*a* closed, the semiconductor substrates 5 are heat treated according to a predetermined thermal profile (FIG. 6B and FIG. 9 (iii)). Treating conditions may be the same as above.
(4) After the heat treatment, the lids 7*a*, 7*b* are simultaneously opened. The boat 6 having semiconductor substrates 5 rested thereon is moved from the predetermined position in the furnace to the boat station 10*b* while another boat having fresh substrates rested thereon is moved from the boat station 10*a* to the predetermined position in the furnace. With the lids 7*a*, 7*b* closed, heat treatment is carried out as above. See FIG. 6A and FIGS. 9 (iv) and (i)-(iii). The above operation may be repeated to treat further substrates.

During movement of the boat into and out of the core tube, the furnace interior may be kept clean by feeding a high-purity gas such as nitrogen, argon or oxygen from the gas inlet conduit 8*c* near the longitudinal center of the core tube 1″ and discharging the gas through small gaps between the lids 7*a*, 7*b* and the openings 2*a*, 2*b* at opposite ends of 1*c*) the core tube. In this embodiment as well, the standby time may be further reduced by moving the heat treated boat out of and moving a next boat into the core tube at the same time.

In the practice of the invention, the structure of the heat-treatment furnace accommodating the core tube defined herein is not particularly limited as long as it is a horizontal furnace having a cylindrical heater enclosing the cure tube.

The heat-treatment furnace of the invention is useful in carrying out the heat treatment of semiconductor substrates and advantageous particularly when the semiconductor substrates are silicon substrates intended for the fabrication of solar cells, specifically for diffusion treatment of p- or n-type dopant into silicon substrates and oxidation treatment of silicon substrates. Besides the dopant diffusion treatment and substrate oxidation treatment, the furnace may be advantageously utilized in any heat treatments which are carried out in a horizontal furnace.

EXAMPLES

Examples and Comparative Examples are given below for further illustrating the invention, but the invention is not limited thereto.

Example 1

Lapped boron-doped p-type silicon wafers having a diameter of 100 mm, a thickness of 200 μm and face orientation (100) prepared by the CZ method (resistivity 1-3 Ω-cm) were provided.

Ten lapped wafers were manually arrayed on a boat of high-purity quartz having a length of 540 mm, a width of 100 mm, and a height of 30 mm, and having 100 channels at a pitch of 2.5 mm.

The heat-treatment furnace of the invention included, as shown in FIG. 1, a quartz core tube 1 of outer diameter 150 mm, inner diameter 142 mm, and length 3,000 mm, provided at opposite ends with openings of inner diameter 142 mm, and lids 7*a*, 7*b* each comprising a quartz disk of diameter 170 mm and thickness 4 mm, a cylindrical quartz box of outer diameter 141.5 mm and width 50 mm fusion bonded to the disk, and a gas inlet conduit 8*a* or 8*b* of inner diameter 5 mm penetrating through the disk and the box.

As the boat standby position before and after heat treatment, boat stations of high-purity quartz each having a wall thickness of 4 mm, a length of 1,000 mm, and a width of 200 mm and defining an arcuate curved surface with a radius of 100 mm and an angle of 60° were provided. Each boat station was spaced 250 mm from the opening in the core tube. The distance from the boat standby position at the center of the boat station to the heat treatment position at the center of the core tube was 2,250 mm.

For each heat treatment batch, the insertion preparatory time (standby time) taken for setting the boat on the boat station was about 1 minute per batch, and the cooling time after removal of the heat treated boat was 15 minutes per batch.

A quartz rod having a length of 2,000 mm and an outer diameter of 15 mm and having a boss of 30 mm height protruding perpendicular to the longitudinal direction was provided for moving the boat into and out of the core tube. The rod was mounted in a full automatic boat loader whereby the boat was moved into and out of the core tube at a constant speed of 200 mm/min.

The heat-treatment furnace was normally set at 830° C., and the boat was moved therein. Phosphorus was deposited for 40 minutes and then driven in at 830° C. for 17 minutes to effect deeper phosphorus diffusion. Thereafter, the boat was taken out.

The gas composition for heat treatment was a gas mixture of 20 L/min nitrogen, 0.3 L/min oxygen, and 0.45 L/min phosphorus oxychloride ($POCl_3$) during phosphorus deposition, and a gas mixture of 20 L/min nitrogen and 0.3 L/min oxygen during other steps including standby, lid opening/closing, insertion and removal of the boat, and drive-in. Under these conditions, diffusion heat treatment was carried out in accordance with the heat treatment flow of FIGS. 5A-5C and the time sequence of FIG. 8.

Example 2

A quartz core tube of outer diameter 150 mm, inner diameter 142 mm, and length 3,000 mm, having openings of inner diameter 142 mm at opposite ends and a gas inlet conduit of inner diameter 5 mm at a position spaced a distance of 1,500 mm from the longitudinal opposite ends of the core tube as shown in FIG. 3 was provided.

Using the same semiconductor substrates and heat-treatment furnace as in Example 1 aside from the core tube of the above structure, diffusion heat treatment was carried out in accordance with the heat treatment flow of FIGS. 6A and 6B and the time sequence of FIG. 9.

Comparative Example 1

Figure 4:
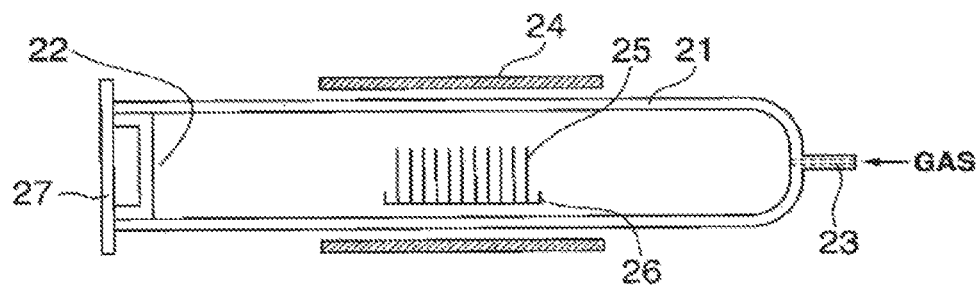
FIG. 4 is a schematic cross-sectional view of one exemplary structure of a conventional furnace core tube.

As shown in FIG. 4, a conventional quartz core tube of outer diameter 150 mm, inner diameter 142 mm, and length 3,000 mm, having an opening of inner diameter 142 mm at one end and a gas inlet conduit of inner diameter 5 mm at the other end, and a lid comprising a quartz disk of diameter 170 mm and thickness 4 mm and a cylindrical quartz box of outer diameter 141.5 mm and width 50 mm fusion bonded to the disk were provided.

Using the same semiconductor substrates and heat-treatment furnace as in Example 1 aside from the core tube and lid of the above structure, diffusion heat treatment was carried out in accordance with the heat treatment flow of FIGS. 7A-7C and the time sequence of FIG. 10.

The substrates obtained in Examples 1 and 2 and Comparative Example 1 were evaluated by the following tests.

1) Sheet Resistance Measurement

The substrate was immersed in 25 wt % HF for 4 minutes to remove the glass coating, rinsed with deionized water, and dried. The sheet resistance was measured at the wafer center by the four-probe analysis.

2) Bulk Lifetime Measurement

The substrate was immersed in 25 wt % KOH at 70° C. for 10 minutes to remove the diffusion layer, rinsed with deionized water, immersed in 1 wt % HF for 1 minute to be water repellent, and subjected to chemical passivation by the iodine methanol method. The bulk lifetime was measured by the micro-PCD method.

3) When Diffusion Heat Treatment was Consecutively Carried out, the Time Taken Per Batch of Heat Treatment was Measured.

TABLE 1

|  | Example 1 | Example 2 | Comparative Example 1 |
|---|---|---|---|
| Average sheet resistance ($\Omega/\square$) | 62.2 | 62.7 | 62.4 |
| Average bulk lifetime (μsec) | 612 | 603 | 608 |
| Time per batch of diffusion (min) | 67 | 53 | 82 |

Examples 1 and 2 display measurement results of sheet resistance and bulk lifetime which are comparable to those of Comparative Example 1 while achieving a substantial saving of the time taken per batch of diffusion.

REFERENCE SIGNS LIST 1, 1', 1'', 21: core tube
2a, 2b, 22: opening
4, 24: heater
5, 25: semiconductor substrate
6, 26: boat
7a, 7b, 27: lid
8a, 8b, 8c, 9a, 9b, 23: gas inlet conduit
10a, 10b, 30: boat station

The invention claimed is:

1. A method for a heat-treatment of semiconductor substrates using a heat-treatment furnace comprising: a cylindrical core tube which is provided at opposite ends with openings having a sufficient size to allow a boat having semiconductor substrates rested thereon to be moved into and out of the core tube, a heater for heating the core tube, lids each of which is detachably mounted to the core tube to block the openings to substantially seal the core tube, a thin gas inlet conduit A disposed near the longitudinal center of the core tube for introducing high-purity gas to keep clean the furnace interior into the core tube during movement of the boat into and out of the core tube, a thin gas inlet conduit B penetrating through the one of the lids for introducing process gas for heat-treatment into the core tube during the heat-treatment of the semiconductor substrates, and a plurality of boats which are capable of having semiconductor substrates rested thereon, comprises the following steps:

(i) moving a boat of the plurality of boats which has semiconductor substrates into the core tube, (ii) heating the semiconductor substrates on the boat in the core tube while introducing process gas for the heat-treatment of the semiconductor substrates from the thin gas inlet conduit B into the core tube, and (iii) moving the boat having the substrates out of the core tube, wherein when the steps (i), (ii) and (iii) are repeated plural times in this order in an overlapping manner, the step (iii) of moving a first boat of the plurality of boats which has heat-treated semiconductor substrates out of the core tube through one of the openings of the core tube and the step (i) of moving a second boat of the plurality of boats which has fresh semiconductor substrates into the core tube through the opening at opposite end of the core tube are performed simultaneously while introducing high-purity gas to keep clean the furnace interior from the thin gas inlet conduit A into the core tube.

2. The method of claim 1, wherein
the step (iii) of moving the first boat having heat-treated semiconductor substrates out of the core tube comprises opening one of the lids, moving the first boat out of the corresponding opening of the core tube and closing the lid, and
the step (i) of moving the second boat having semiconductor substrates into the core tube comprises opening the lid at the opposite end of the core tube, moving the second boat into the corresponding opening at the opposite end of the core tube and closing the lid at the opposite end of the core tube.

3. The method of claim 1, wherein during movement of the first and second boats into and out of the core tube, the thin gas inlet conduit A is opened and the thin gas inlet conduit B is closed, and during the heat-treatment of the semiconductor substrates, the thin gas inlet conduit A is closed and the thin gas inlet conduit B is opened.

4. The method of claim 1, wherein the heat treatment is intended to diffuse a p- or n-type dopant into silicon substrates.

5. The method of claim 1, wherein the heat treatment is intended to oxidize silicon substrates.

6. The method of claim 1, wherein the heat-treatment furnace further comprises at least one boat station disposed outside the core tube and in proximity to one of the openings in the core tube, the boat station carrying the boat having semiconductor substrates rested thereon on standby.

7. The method of claim 6, wherein the first boat having heat-treated semiconductor substrates is moved out of the core tube to one boat station for cooling.

8. The method of claim 7, wherein the second boat having fresh semiconductor substrates is moved from the other boat station into the core tube for heat-treating.

* * * * *